United States Patent
Biloiu et al.

(10) Patent No.: US 8,901,820 B2
(45) Date of Patent: Dec. 2, 2014

(54) RIBBON ANTENNA FOR VERSATILE OPERATION AND EFFICIENT RF POWER COUPLING

(75) Inventors: Costel Biloiu, Rockport, MA (US); Craig Chaney, Lanesville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 112 days.

(21) Appl. No.: 13/362,052

(22) Filed: Jan. 31, 2012

(65) Prior Publication Data

US 2013/0193848 A1  Aug. 1, 2013

(51) Int. Cl.
*H01J 7/24* (2006.01)

(52) U.S. Cl.
USPC ............ 315/111.41; 315/111.21; 315/111.31; 315/111.51

(58) Field of Classification Search
USPC ............. 315/111.21, 111.01, 111.41, 111.31; 438/74; 118/723 AN
See application file for complete search history.

(56) References Cited

U.S. PATENT DOCUMENTS

| | | | |
|---|---|---|---|
| 5,681,393 A | 10/1997 | Takagi | |
| 6,259,209 B1 * | 7/2001 | Bhardwaj et al. | 156/345.12 |
| 6,534,922 B2 * | 3/2003 | Bhardwaj et al. | 315/111.51 |
| 8,142,607 B2 * | 3/2012 | Biloiu et al. | 156/345.39 |
| 8,216,433 B2 * | 7/2012 | Yonesu | 204/157.43 |
| 8,415,885 B2 * | 4/2013 | Yamazawa | 315/111.51 |
| 8,438,990 B2 * | 5/2013 | Kudela et al. | 118/723 E |
| 8,497,213 B2 * | 7/2013 | Yasui et al. | 438/714 |
| 2001/0011525 A1 * | 8/2001 | Ishii | 118/723 AN |
| 2005/0183668 A1 | 8/2005 | Lee et al. | |
| 2007/0251451 A1 | 11/2007 | Nguyen et al. | |
| 2009/0139658 A1 * | 6/2009 | Lea et al. | 156/345.41 |
| 2010/0055345 A1 * | 3/2010 | Biloiu et al. | 427/569 |
| 2011/0259269 A1 * | 10/2011 | Biloiu et al. | 118/723.1 |
| 2012/0248066 A1 * | 10/2012 | Yamazawa | 216/68 |

FOREIGN PATENT DOCUMENTS

| | | |
|---|---|---|
| JP | H09-245993 A | 9/1997 |
| WO | 2011/022612 A2 | 2/2011 |

OTHER PUBLICATIONS

Shinohara, Shunjiro, et al., Development of Very Large Helicon Plasma Source, Review of Scientific Instruments, Jun. 2004, pp. 1941-1946, vol. 75, No. 6, American Institute of Physics.

International Search Report and Written Opinion mailed Jul. 9, 2013 for PCT/US2013/020645 filed Jan. 8, 2013.

* cited by examiner

*Primary Examiner* — Douglas W Owens
*Assistant Examiner* — Srinivas Sathiraju

(57) ABSTRACT

A plasma processing apparatus and method are disclosed which allows switching between the E and H operation modes and also increase the coupling efficiency of the RF power to the plasma. This apparatus may increase plasma density by a factor of about 1.25-1.65 for a given power output. Simultaneously, due to the high efficiency, the need to cool the antenna may be eliminated. A new antenna geometry which increases the amount of surface area for a given volume is used to take advantage of skin effects associated with RF electric current. In some embodiments, the antenna has a single turn to reduce proximity effects. The antenna may also be embedded in a ferrite material to further optimize its performance.

10 Claims, 8 Drawing Sheets

RIBBON ANTENNA FOR VERSATILE OPERATION AND EFFICIENT RF POWER COUPLING

BACKGROUND

A plasma processing apparatus generates a plasma in a chamber which can be used to treat a workpiece supported by a platen in a process chamber. In some embodiments, the chamber in which the plasma is generated is the process chamber. Such plasma processing apparatus may include, but not be limited to, doping systems, etching systems, and deposition systems. In some plasma processing apparatus, such as ion assisted deposition, ions from the plasma are extracted and then steered towards a workpiece. In a plasma doping apparatus, ions may be accelerated to a desired energy so as to create a certain dopant depth profile in the physical structure of the workpiece, such as a semiconductor substrate.

In some implanters, the plasma may be generated in one chamber, which ions are extracted from, and the workpiece is treated in a different process chamber. One example of such a configuration may be a beam line ion implanter where the ion source utilizes an inductively coupled plasma (ICP) source.

Turning to FIG. 1, a block diagram of one exemplary plasma processing apparatus 100, which uses inductive coupling, is illustrated. The plasma doping apparatus 100 includes a plasma chamber 101 used to generate ions and a processing chamber 104 used to implant semiconductor wafers. A dielectric window 102 (usually made of quartz, alumina or sapphire) is used to couple the electrical power from an RF generator 151 to the working gas. At the opposite side of the plasma chamber 101 an extraction plate 103 having an extraction slit 105 or an array of extraction slits of different geometries is used for extraction of ions. The working gas is introduced in the plasma chamber 101 through gas inlets 106 symmetrically distributed with respect to the extraction slit 105 and in such geometry to ensure a uniform gas flow in the plasma chamber 101 cross-section.

Plasma is generated inside the plasma chamber 101 by coupling the RF power from the RF generator 151 to a pancake type or planar antenna 152. The variable plasma impedance is matched with the 50Ω generator impedance by a matching network 153.

Plasma uniformity may be improved by a magnetic multicusp configuration composed of magnets 107, which may be permanent magnets. The magnetic field strength of the magnets 107 is enhanced by the steel yokes 108, which act to close the field lines outside plasma chamber 101. The magnets 107 are arranged in an alternating pattern so that the magnetization direction points alternatively inward and outward of plasma chamber 101. In this way the multicusp field lines geometry prevent charged particles for being lost at the walls, thus increasing the plasma density and uniformity. To reduce the level of impurities in the plasma that might come from the sputtering of the walls, thin liners 109 made of SiC, quartz, or Si sprayed Al can be used.

Depending on the desired dopant species (typically P for n-type doping and B for p-type doping, but other species such as As, Ge, Ga, In, etc. may also be used) different feedstock gases containing the dopant atoms can be fed into the plasma chamber 101 at variable flow rates by a gas manifold 111. The gas manifold is comprised of gas containers 112, valves 113, and mass flow controllers 114. The vacuum pumping is performed through the extraction slit 105 by a turbomolecular pump 115 backed by rotary pump 116. In other embodiments where an independent control of the flow rate and pressure in the plasma chamber 101 is desired, a separate pumping line for the plasma chamber 101 may be used. Because the photoresist that is present on the wafer releases large amount of hydrogen during the implantation process, in addition to turbomolecular pump 115 and rotary pump 116, a cryo pump 117 may be used to pump the processing chamber 104 due to its high efficiency at pumping out hydrogen. The pressure in the plasma chamber 101 and the processing chamber 104 is monitored by a Baratron gauge 118 and a Bayard-Alpert gauge 119, respectively.

To extract positive ions, the plasma chamber 101 is maintained at a positive electric potential by an extraction power supply 121 while the processing chamber 104 may be at ground potential. A high voltage bushing 122 ensures electrical insulation between the plasma chamber 101 and processing chamber 104.

The ion beam 130 is extracted from the plasma source by a triode (a three electrode electrostatic lens) composed of the face plate 103, suppression electrode 131 and ground electrode 132 electrically insulated one from each other by ceramic high voltage insulators 133. In other embodiments, a tetrode (four electrode lens) or a pentode (five electrode lens) may be used for ion beam extraction. Because the plasma chamber 101 is at positive potential, positive ions are pulled out from the chamber 101 by the ground electrode 132. Most of the extracted ions will pass through the slit 134 in the ground electrode 132 but some will strike the ground electrode 132. When such an event occurs, secondary electrons are generated. To prevent secondary electrons from streaming back toward the source, the suppression electrode 131 which is interposed between the extraction electrode 103 and the ground electrode 132 is polarized at negative potential by a suppression power supply 135. The connection of the suppression power supply 135 with suppression electrode 132 is achieved through a high voltage feedthrough 136.

The extracted ion beam 130 is steered toward the wafer 143 which is disposed on a platen 142, which may be grounded. The platen 142 may be adapted able to move back and forth to expose the entire wafer surface to the ion beam 130.

Since it is on the ion source side, the whole RF system floats at the extraction potential. The antenna 152 has one leg connected to the matching network 153 output and the other leg at the elevated ground. In some embodiments, a high voltage capacitor (not shown) is inserted in the ground leg to make an even voltage distribution over the antenna 152 length. Once the RF power is applied, an RF current start to flow through antenna 152. The RF current generates a time varying magnetic field, which, according to Maxwell's $3^{rd}$ electrodynamics law induces an electric field in the proximity of the antenna 152. Because of long mean free path due to the lower pressure in the plasma chamber 101, the electric field is able to accelerate free electrons to such an energy that a collision with a gas particle (atom, molecule) will result in an ionization process. Most of the RF power for deposition and, implicitly the ionization processes, occur in the vicinity of the dielectric window 102 in a skin layer of few Debye length.

Continuous operation may lead to wafer charge build-up, followed by catastrophic damage to the features on the wafer 143. Therefore, in some embodiments, the ion beam 130 is pulsed. A pulse modulator 161 can drive synchronously both the extraction power supply 121 and the suppression power supply 135, thereby allowing changing of the pulse frequency and duty cycle.

In some embodiments, the planar antenna 152, might have a spiral-like shape as shown in FIG. 2A or serpentine like shape as shown in FIG. 2B. In all cases, the antenna 152 is made of electrically conductive material, such as aluminum, copper or silver plated copper, preferably in a tubular shape to allow water cooling. In other embodiments, the whole antenna 152 is immersed in a dielectric resin, thus allowing direct contact between the antenna 152 and the dielectric window 102.

Inductively coupled plasma source operation is based on energy transfer from the RF power generator 151 to the plasma electrons via an antenna 152. However, in the initial stage of the discharge, the RF power is coupled capacitively (E mode operation), therefore the antenna 152 acts as a plate of a capacitor. In such cases, the electrons gain energy from the electric field in the direction perpendicular to the plane containing the antenna 152 either through ohmic heating or stochastic heating. Larger plate area creates better capacitive coupling and implicitly easier gas breakdown. Once the plasma is ignited, the RF coupling evolves toward the inductively coupled mode (H mode operation), but some capacitive coupling still remains. Because there are inherent losses in the antenna 152 and the matching circuit 153, the coupling efficiency ($\eta$) of the antenna 152 is usually in the range between 0.6 and 0.8. Higher coupling efficiency means better electron heating, a larger number of ionization events and, in fact, higher plasma density and implicitly higher extracted ion beam current. Assuming perfect RF matching (i.e. zero reflected power) and negligible losses in the matching capacitors, antenna efficiency is given by the ratio of the amount of power transferred to the plasma ($P_p$) to the total amount of power delivered by the generator ($P_G$). It can be related to the power loss in the antenna ($P_{loss}$)

$$\eta = P_p/P_G \cong 1 - P_{loss}/P_G \quad (1)$$

From Eq. (1) it can be seen that one way to increase the power coupling efficiency is by decreasing the amount of power losses ($P_{loss}$).

As shown in FIG. 3, H mode operation is characterized by high plasma density ($>5 \times 10^{10} - 1 \times 10^{12}$ cm$^{-3}$), low plasma potential, and low electron temperature ($<3$ eV) whereas E mode operation is characterized by low plasma density ($<1 \times 10^{10}$ cm$^{-3}$), high plasma potential and high electron temperature. The triangles in FIG. 3 represent the plasma potential (which scales proportionally with electron temperature). The value of the plasma potential can be read on the right scale. The circles in FIG. 3 represent the plasma density, the values of which can be read on the left scale. For certain applications it is desired that some processes to be run in H mode while others in E mode.

Therefore, it would be beneficial if there were a system that will allow in situ switching from H mode to E mode and vice versa. Also, when running in H mode, it would be beneficial to have a system and a method for increasing the coupling efficiency and therefore, boosting the plasma density. Such a system may also advantageously reduce the cooling requirements for the antenna.

SUMMARY

A plasma processing apparatus and method are disclosed which allows switching between the E and H operation modes and also significantly increase the coupling efficiency of the RF power to the plasma. This apparatus may increase plasma density by a factor of about 1.25-1.65 for a given power output. Simultaneously, due to the high efficiency, the need to cool the antenna may be eliminated. A new antenna geometry which increases the amount of surface area for a given volume is used to take advantage of skin effects associated with RF electric current. In some embodiments, the antenna has a single turn to reduce proximity effects. The antenna may also be embedded in a ferrite material to further optimize its performance.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As described above, traditional ICP ion sources typically produce a plasma based on energy transfer from the RF power generator to the working gas via the antenna. The mechanism of power transfer from the antenna to the plasma is based on the Maxwell's 3$^{rd}$ electrodynamics law:

$$\nabla \times \vec{E} = -\frac{\partial \vec{B}}{\partial t} \quad (2)$$

The electric field ($\vec{E}$) induced in the plasma is proportional to the temporal variation of the magnetic field ($\vec{B}$) generated by the antenna which, in turn, is proportional with the electric current flowing through the antenna. Therefore, it may be preferable to have an antenna with very low resistance because the overall antenna resistance will be small. Usually, RF antennae are constructed from copper tubing. Copper has very good electric and thermal conductivity. Furthermore, the use of tubing allows for the possibility of water cooling. The tubing wall is few mm thick to allow bending and to decrease electrical resistance. However, what is often forgotten is that unlike DC, in RF frequency range electric current does not flow through the whole cross-section of the conductor but through a skin layer of depth $$\delta = \sqrt{\rho/\pi f \mu} \quad (3)$$

where $\rho$, $f$, and $\mu$ represent resistivity, RF frequency, and magnetic permeability, respectively. For 13.56 MHz, the skin depth in copper is ~18 µm. It follows then that a conductor whose shape has a large surface area will have lower electrical resistance than a conductor with a large cross-sectional area but smaller surface area. In other words, a thin antenna will have superior characteristics to a thicker one.

Figure 4:
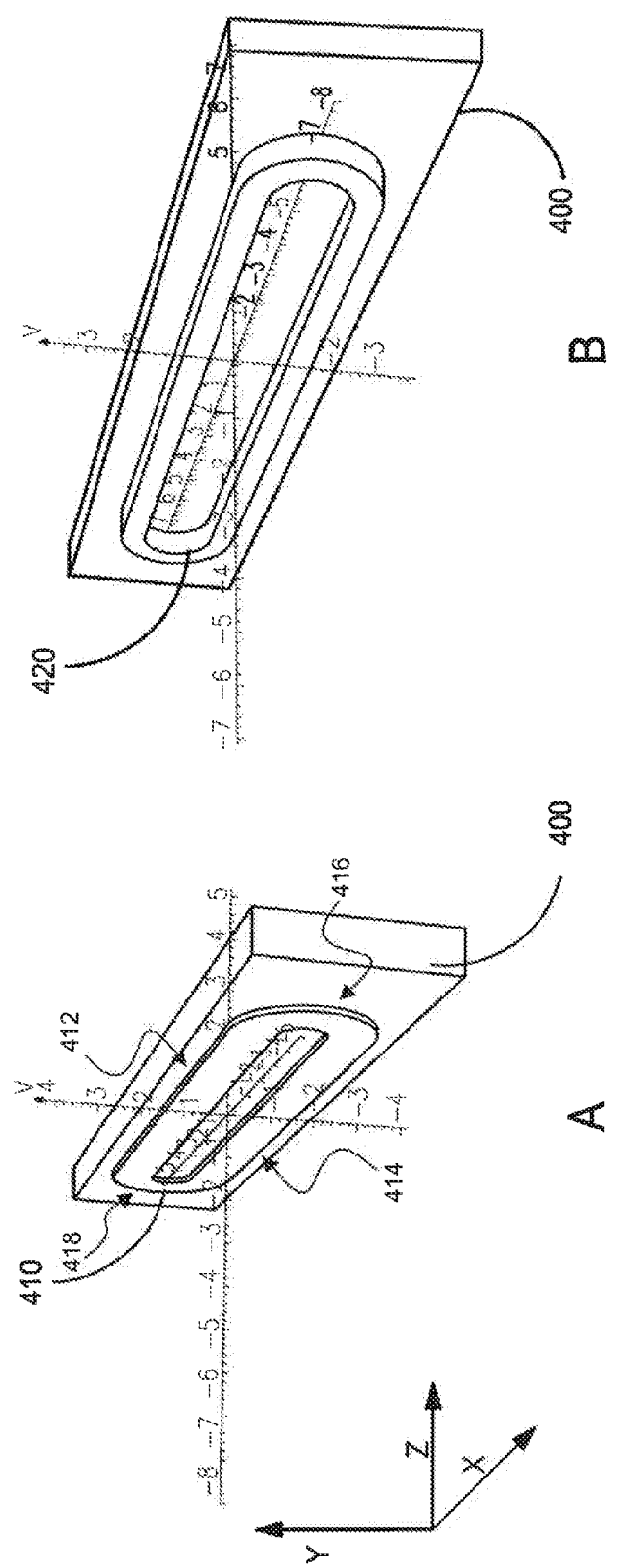
FIGS. 4A-B are configurations of two different antennae.
Figure 7:
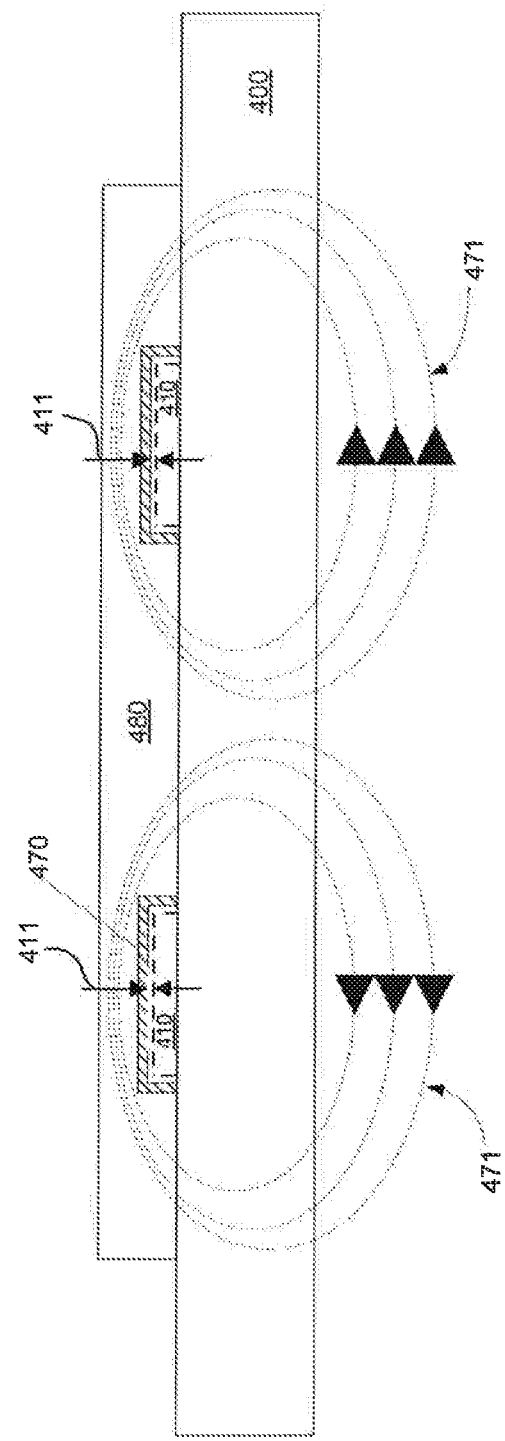
FIG. 7 is another embodiment of a ribbon antenna which uses a ferrite to enhance the magnetic field in the plasma.
Figure 8A:
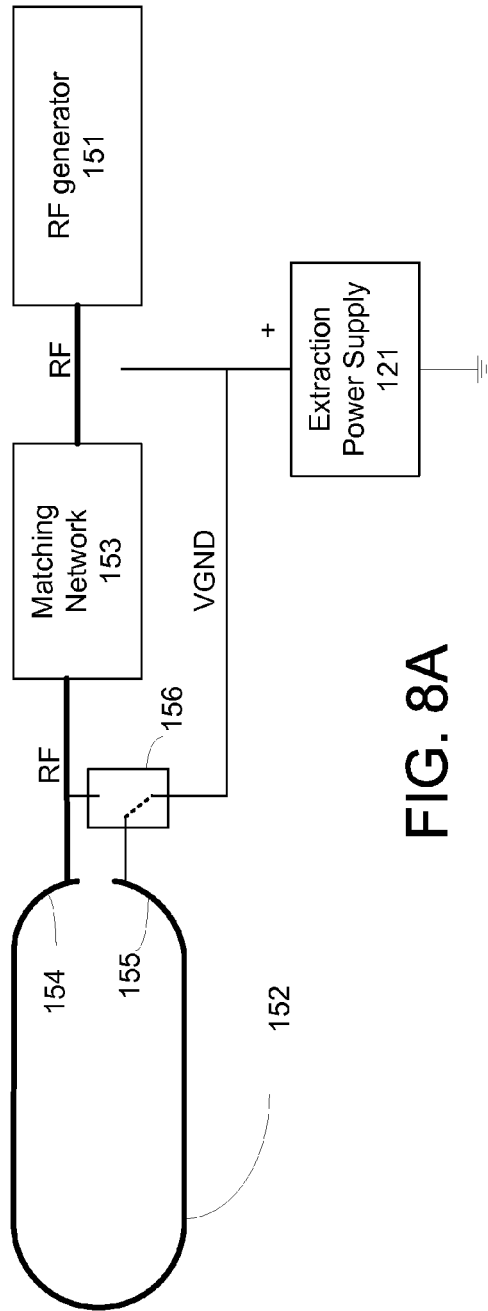
FIGS. 8A-B show an embodiment where the antenna can selectively operate in H or E mode.
Figure 8B:
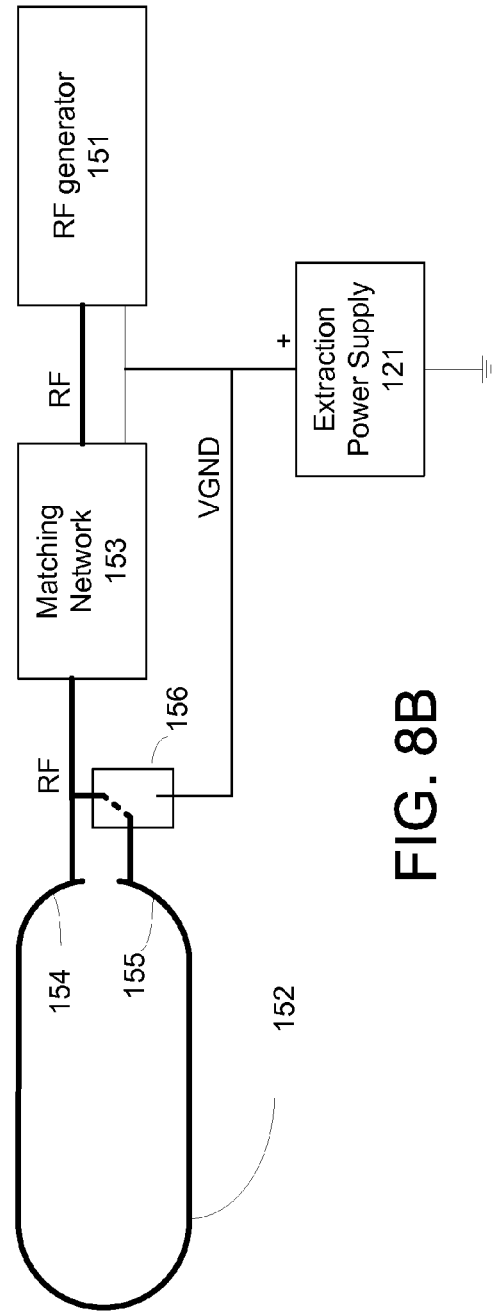

In one embodiment, an antenna is constructed in the shape of a thin ribbon, which may be roughly 1 inch wide by ⅛ inch thick (i.e., 1"×⅛"). The ribbon antenna 410 may include two substantially parallel portions 412, 414, with semi-circular ends 416, 418, as shown in FIG. 4A. In some embodiments, one of the semi-circular ends may have a discontinuity, thereby creating two legs 154, 155 of the antenna, as best seen in FIG. 8B. The antenna may be constructed of a conductive material, such as copper or silver plated copper. The wide ribbon shape exposes the dielectric window 400 to a large surface area, which is a significant portion of the entire volume. This shape may allow lower antenna resistance which, in turn, means higher current and low dissipated power (low heat). A simulation in OPERA for the two antennae shown in FIGS. 4A-B was performed. Each antenna comprises a single turn, the same external surface area, and carries the same amount of current. The ribbon antenna 410 of FIG. 4A has a flat thin profile, while the square antenna 420 of FIG. 4B has a square profile. Each antenna 410, 420 is disposed against a dielectric window 400. In both simulations, identical RF skin depth of 20 μm was considered. For clarity of illustration, a skin depth 411 for the ribbon antenna 410 is illustrated in the embodiment of FIG. 7.

Figure 5:
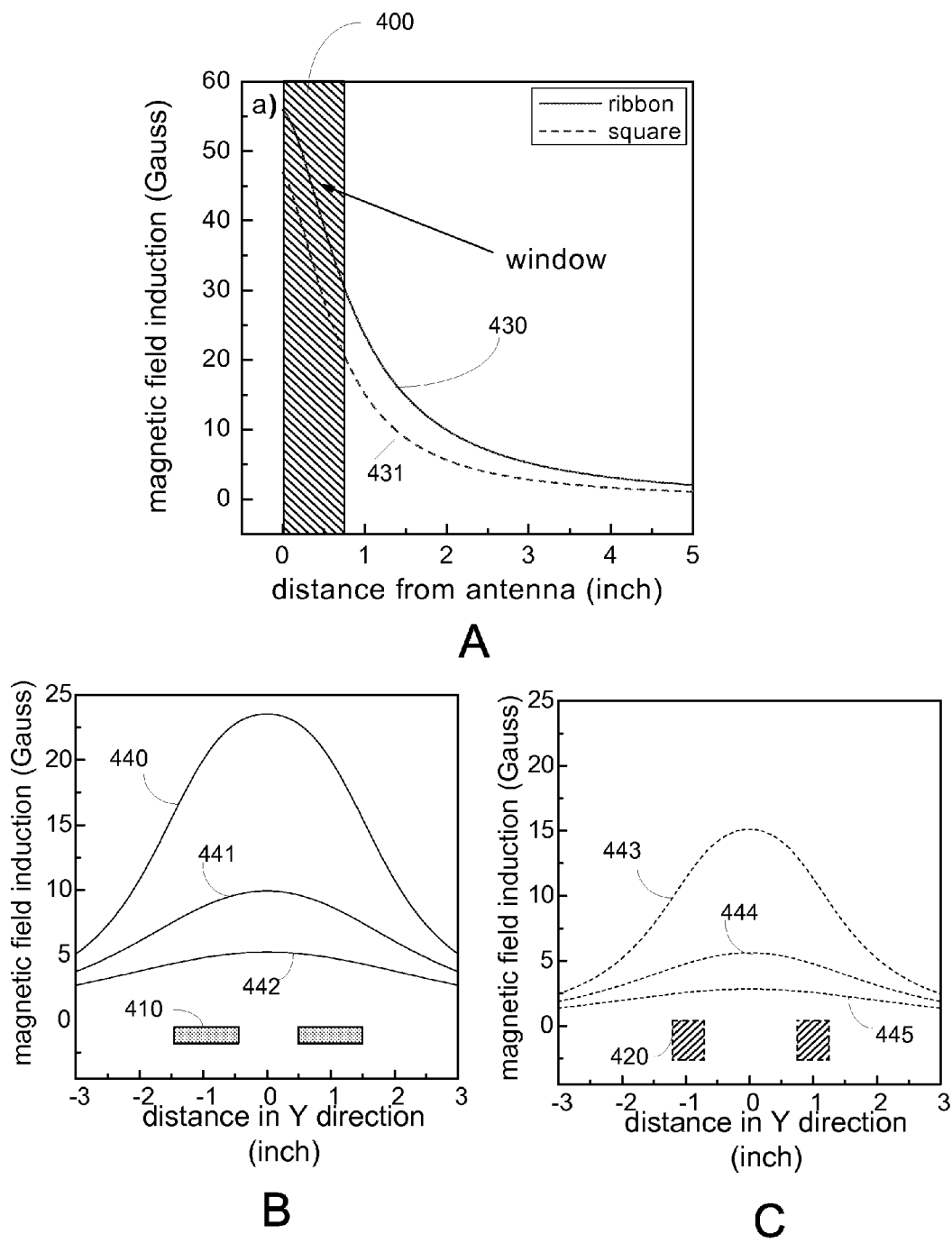
FIGS. 5A-C illustrate the magnetic fields generated by the antennae in FIGS. 4A-B.

FIG. 5A shows the results of this simulation. This figure shows the magnitude of the magnetic field as a function of distance from the antenna (in the z direction). In this FIG. 5A, the antennae are assumed to be placed at z=0 (i.e., against a dielectric window 400 of FIGS. 4A-B), and the magnetic field is measured moving into the plasma source. Line 430 shows the magnetic field for the ribbon antenna 410, while line 431 shows the magnetic field for the square antenna 420. The simulation in FIG. 5A shows that approximately at 1.5"-2" in z direction from the antennae (which is the location where most of the power deposition occurs, as it corresponds to the plasma skin depth), the value of the magnetic field induction generated by the flat antenna 410 is roughly double than corresponding value of the field generated by square profile antenna 420.

FIGS. 5B-C show the magnetic field strength distribution (along Y axis) for different distances from the antenna. The dotted lines represent the magnetic fields corresponding to the square antenna 420. The solid lines represent the magnetic fields generated by the ribbon antenna 410. For clarity, FIG. 5B shows only the magnetic fields generated by the ribbon antenna 410. Line 440 is the magnetic field at a z distance of 0 inches, while line 441 represents the magnetic field 1 inch from the ribbon antenna and line 442 represents the magnetic field 2 inches from the ribbon antenna. The location of ribbon antenna 410 is shown as well, indicating that the magnetic field is strongest within the loop of the ribbon antenna 410, and decays moving away from the antenna. Note that, according to line 442, the magnetic field is 5 Gauss in the center of the antenna (i.e. Y=0) at a z distance of 2 inches. FIG. 5C shows only the magnetic field strength generated by the square antenna 420. For clarity of comparison, the magnitude of the scale is the same as in FIG. 5B. Line 443 is the magnetic field at a z distance of 0 inches, while line 444 represents the magnetic field 1 inch from the square antenna and line 445 represents the magnetic field 2 inches from the square antenna. The location of square antenna 420 is shown as well, indicating that the magnetic field is strongest within the loop of the square antenna 420, and decays moving away from the antenna. Note that, according to line 445, the magnetic field is about 2.5 Gauss in the center of the antenna (i.e. Y=0) at a z distance of 2 inches. In other words, the ribbon antenna 410 provides roughly twice the strength of magnetic field as the square antenna 420 for identical RF power values and spatial positions.

Figure 6:
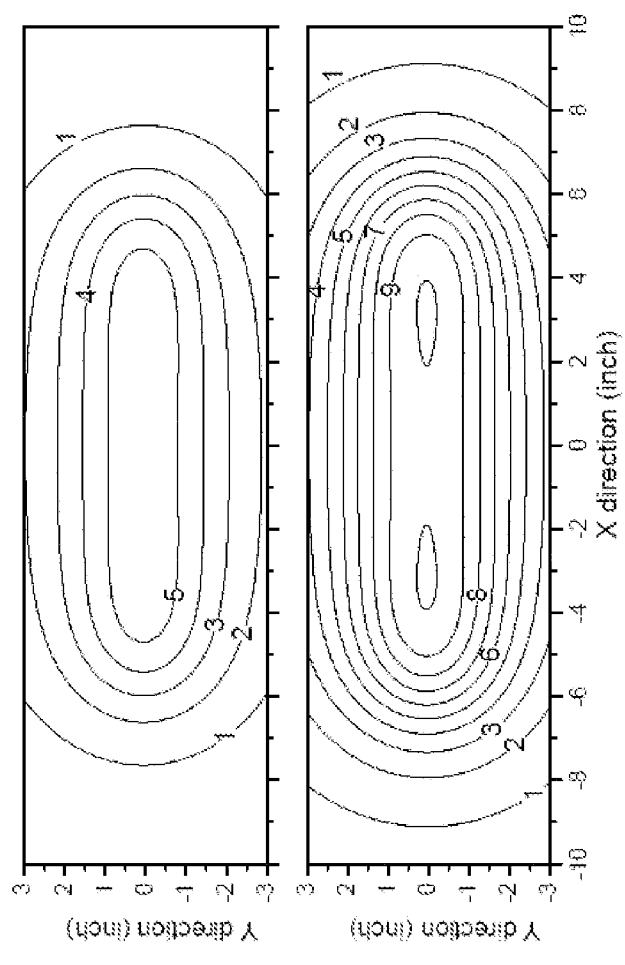
FIGS. 6A-B are two dimensional contour maps of the magnetic fields strength generated by the antennae of FIGS. 4A-B, where the numbers represent the magnetic field strength in Gauss.

FIGS. 6A-B are two-dimensional contour maps showing the magnetic fields generated by the square ribbon antenna 420, and ribbon antenna 410, respectively. The contour lines are numbered, where the numbers represent the magnetic field strength in Gauss. FIG. 6B shows far greater field strength in the region contained within the loop of the antenna, as compared to FIG. 6A. Note that the same power was applied to both antenna, indicating that greater efficiency and coupling is achieved in FIG. 6B.

Therefore, a ribbon antenna design significantly increases the strength of the magnetic field that is generated. This is because, as described above, the current is carried by the antenna only in the skin depth. Thus, added thickness beyond the skin depth is not beneficial. In addition, it may be important to optimize the amount of current carrying material that abuts the RF dielectric window 400. For example, a copper tube has an inner diameter, which carries current, but is not in contact with the dielectric window. Furthermore, the shape of a tube also means that little of the outer diagram is actually in contact with the dielectric window. By utilizing a ribbon shape, the amount of antenna that actually contacts the dielectric window is maximized. Furthermore, by configuring the ribbon such that its width is much greater than its thickness, the percentage of current carrying material is optimized. The thickness of the ribbon is set by the frequency and material electrical resistivity dependent skin depth. For a 2 MHz driving frequency and copper, the skin depth is approximately 46 micrometers and would be smaller for higher frequencies. For 90% attenuation and taking 2×(skin depth) it will result in an approximate 200 micrometers thickness. However, unless embedded in a dielectric potting such a thin structure may not have enough mechanical strength to sustain a wide antenna. Therefore, given the necessity of mechanical strength, an optimal value for the skin depth/ribbon thickness ratio may be approximately 0.05-0.1.

In one embodiment, a ribbon antenna may provide a large flat surface to abut the dielectric window, while optimizing current carrying capability by minimizing the thickness of the antenna.

As stated above, an important consideration is the current being carried by the antenna that abuts the dielectric window. Therefore, large diameter tubular shaped antennae may be inefficient, as little of the antenna is actually proximate the dielectric window. Thus, to maximize the power transfer, it may be advantage to maximize the ratio of the effective current-carrying cross-section (in a plane perpendicular on the window) abutting the window to the total cross-section of the antenna. Expressed differently, the effective current-carrying cross-section may be defined as the width of the antenna in contact with the dielectric window, multiplied by the skin depth. As can be seen from this ratio, antennae with a circular cross-section achieve a very low ratio, while flat antennae achieve much higher ratios. Ideally, the best power transfer is achieved when the ratio of effective current-carrying cross-section to total cross-section approaches 1. However, with skin depths of roughly 46 micrometers, this is not possible. Therefore, ratios over approximately 0.001 are used in one embodiment, with ratios over approximately 0.01 used in another embodiment, and ratios over approximately 0.05 used in another embodiment. In the case where the antenna is embedded in a potting material, it may not need mechanical strength to sustain the antenna structure. Therefore, the ribbon thickness can be as low as approximately 2-3 skin depths, which means skin depth/ribbon thickness ratio of approximately 0.3-0.5.

Figure 2A:
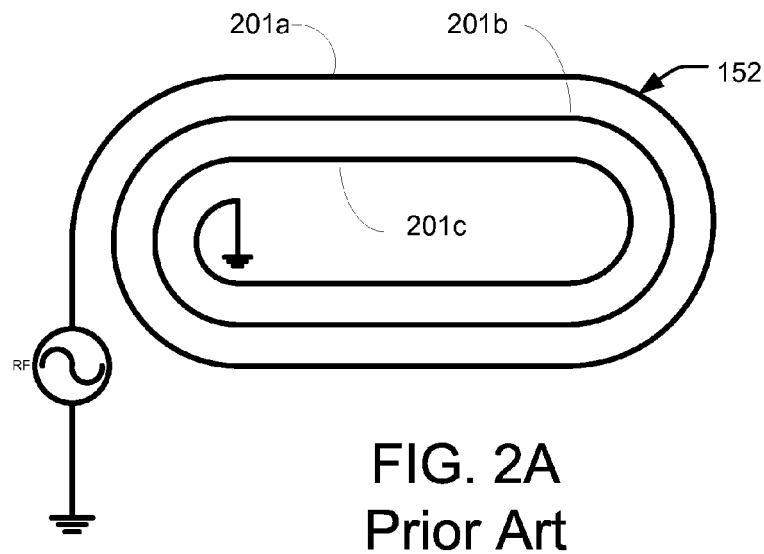
FIG. 2A illustrates a spiral type planar antenna of the prior art.
Figure 2B:
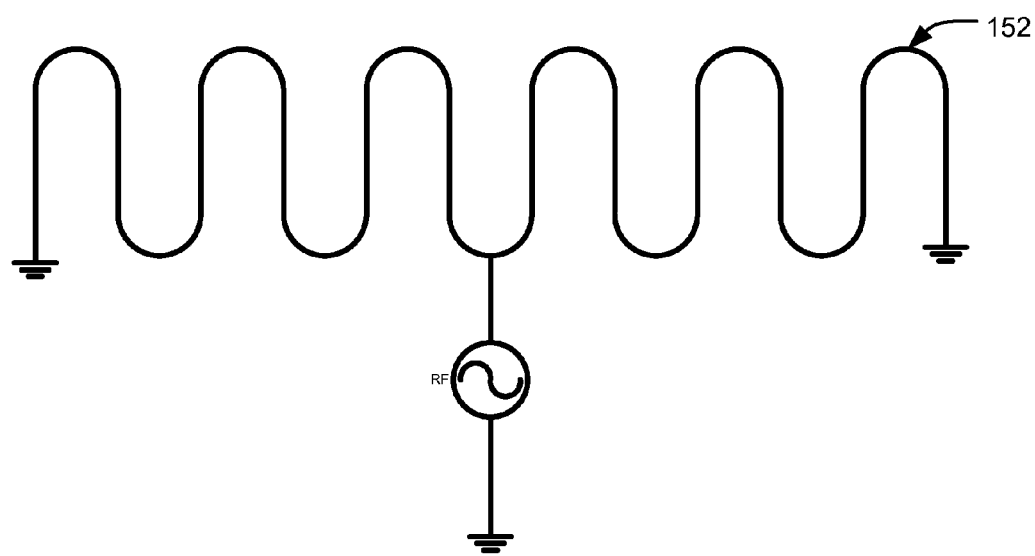
FIG. 2B illustrates a serpentine type planar antenna of the prior art.
Figure 3:
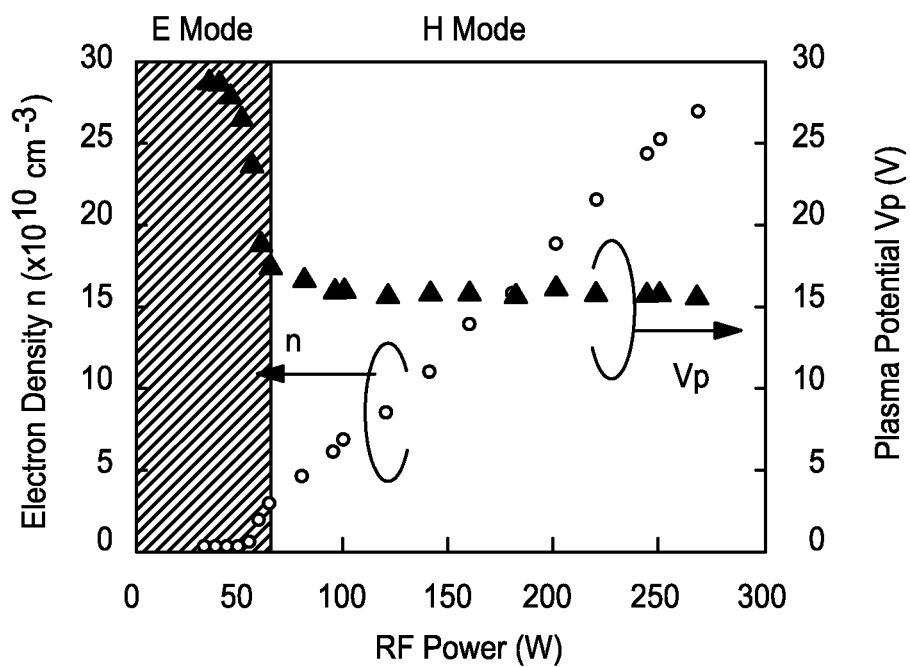
FIG. 3 illustrates the plasma density and plasma potential as a function of power in E and H modes.

In order to cover a large portion of the plasma chamber cross-section and thus to allow relatively uniform power deposition and consequently uniform plasma density and uniform extracted ion beam current, usually antennae having 2-3 turns are used, as shown in FIG. 2A. Note that in FIG. 2A, there are multiple turns, 201a, 201b, and 201c. While multiple turns increase uniformity, two or more turns also give rise to the so-called "proximity" effect. The eddy current induced in an antenna branch, such as 201a, by the current flowing in the same direction in an adjacent branch, such as 201b, decreases the total current flowing on the side facing the other branch and increases the current on the opposite side (the side non-facing the induction branch). In terms of resistance, this effect is seen as a reduction of the conductor cross-section and implicitly higher antenna resistance.

Decreasing the number of turns (N) may also help decreasing the quality factor, Q. Because the inductance scales with $N^2$ and the resistance scales with N, the overall Q will be smaller, allowing a wider range of antenna tuning capabilities. This is especially useful when plasma matching is necessary over a wide range of powers, pressures, and gas species.

Thus, in some embodiment, the ribbon antenna comprises only one turn. This will allow symmetrical voltage drop along X direction, since the powered and grounded legs are located at the same spatial position. Furthermore, it allows significant reduction of the detrimental "proximity" effects.

The estimated resistance of such antenna may be below 0.05Ω. For such low resistance, even at high power operation levels, such as greater than 4-5 kW, the antenna will dissipate a small amount of heat (approximately 5-10 W). Thus, in some embodiments, the antenna will not need to be actively cooled. However, in other embodiments, such as extremely high power levels, such as >10 kW, attachment of a cooling bracket to the ribbon antenna may be performed to eliminate excess heat.

In another embodiment, the ribbon antenna 410 may be embedded in a ferrite material 480, as shown in FIG. 7. The ribbon antenna 410 having the skin depth 411 and positioned on the dielectric window 400 may be encased in a potting material 470. The potting material 470 serves to insulate the antenna 410 from the ferrite material 480. In this configuration, magnetic field lines 471 oriented opposite the plasma that otherwise will be lost will be captured by the ferrite material 480 and redirected toward the plasma, thereby allowing a higher power deposition efficiency. The ferrite material 480 may be a material, such as M61 or M67, that has a loss factor below $10^{-4}$ and relative magnetic permeability of at least 20. The ferrite material 480 should follow the antenna shape and fit on the dielectric window 400. The potting material 470 may be a material such as 3-6751 Dow Chemical thermal adhesive and may have a high dielectric strength (>10 kV/mm), low dielectric loss (<1×$10^{-4}$) and bubble free hardening.

Figure 1:
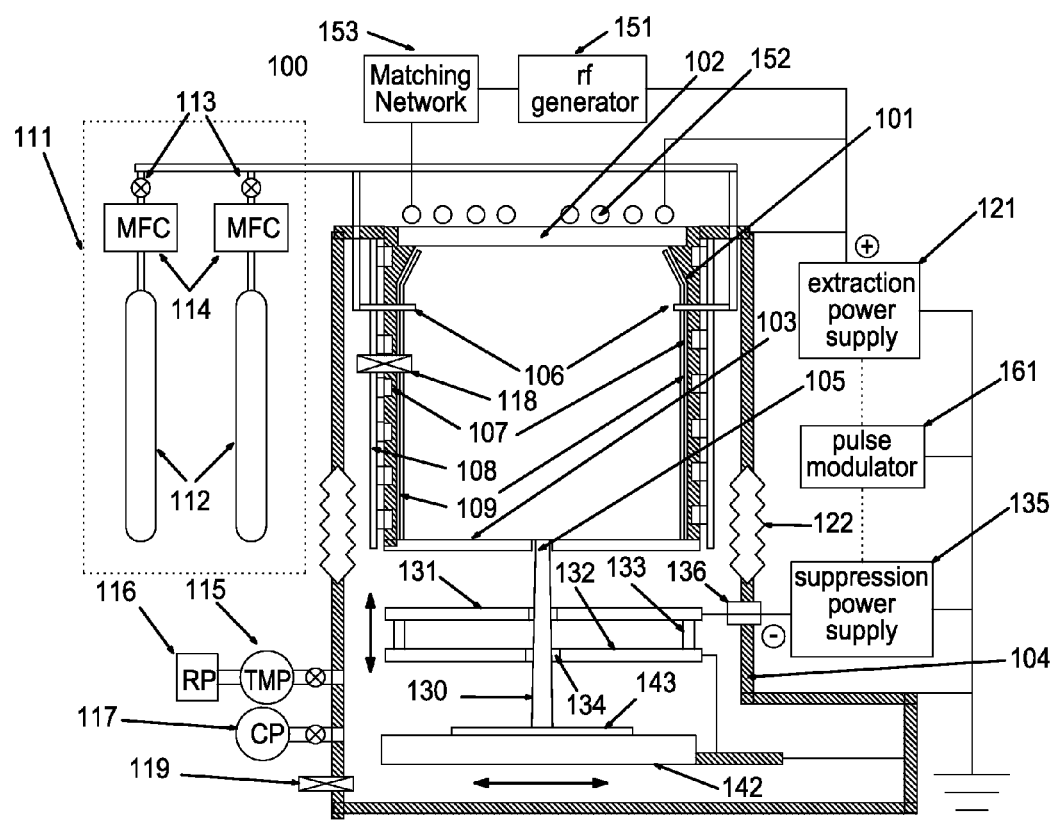
FIG. 1 is a block diagram of a plasma doping apparatus of the prior art.

As shown in FIG. 1, the plasma chamber is at a virtual (elevated) electric ground, which is the output potential generated by the extraction power supply 121. The RF voltage developed on the antenna 152, by applying RF power from the RF generator 151 is above this potential. Therefore, in order to operate as an ion source the plasma chamber 101, the gas manifold 111, and the antenna 152 should be electrically insulated from the earth ground (GND).

In some embodiments, it may be beneficial to have the antenna 152 be capable of operating in either E mode or H mode. As shown in FIG. 8A, when desired to work in the H mode, one leg 154 of antenna 152 is fed from the hot wire of the matching network 153 (the thick line denoted by RF in FIG. 8A), whereas the other leg 155 is at the virtual ground (the thin line denoted by VGND, which is the output DC potential of extraction power supply 121). A switch 156, which may be remote controlled, can connect or disconnect the other leg 155 to the virtual ground (extraction power supply 121 potential). When the leg 155 is at virtual potential, the antenna 152 works in ICP mode as shown in FIG. 8A. In another mode, when the leg 155 is electrically shorted to the powered leg 154 as shown in FIG. 8B, the system works in capacitively coupled plasma (CCP) mode. In this case, the remote controlled switch 156 can disconnect the "grounded" leg 155 from the extraction power supply 121 and electrically connect it to the other leg 154. In this fashion, the antenna 152 is acting as a powered electrode and the chamber walls are acting as a ground electrode.

In some embodiments, a controller (not shown) is used to actuate the switch 156. In some embodiments, the controller may switch from H mode to E mode, or vice-versa, during operation. In other words, the plasma generation mode may be changed while plasma is being generated. This in-situ change may be used, for example, where one mode may be preferably at the plasma ignition stage, while the other mode may be preferably once the plasma is operating at high power levels. While the above described used a ribbon antenna as an illustrative example, the disclosure is not limited to this embodiment. Any antenna having two ends can be used, where one end is electrically connected to a RF power source, and the other end is electrically connected to a switch having at least two positions, as described above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma generation apparatus, comprising: a chamber having a dielectric window; wherein an antenna comprises a ribbon shaded antenna and said antenna abutting said dielectric window, constructed of a material and having a thickness, a width in contact with said dielectric window, and a cross-sectional area defined as a product of said width and said thickness; and a power supply operating at a frequency and in communication with said antenna, wherein said material and said frequency determine a skin depth where most current is carried in said antenna, and wherein a product of said skin depth and said width is greater than 0.001 multiplied by said cross-sectional area of said antenna.

2. The plasma generation apparatus of claim 1, wherein said product is greater than 0.01 multiplied by said cross-sectional area.

3. The plasma generation apparatus of claim 1, wherein said product is greater than 0.05 multiplied by said cross-sectional area.

4. The plasma generation apparatus of claim 1, further comprising a ferrite material, wherein said antenna is disposed between said ferrite material and said dielectric window.

5. The plasma generation apparatus of claim 4, further comprising a potting material disposed between said antenna and said ferrite material.

6. The plasma generation apparatus of claim 1, wherein said antenna comprises two substantially parallel portions and two semi-circular ends.

7. The plasma generation apparatus of claim 6, wherein one of said semi-circular ends comprises a discontinuity, thereby creating two legs of said antenna.

8. The plasma generation apparatus of claim 7, wherein a first of said legs is in communication with said power supply, and a second of said legs is in communication with a switch, wherein said first leg and second leg are electrically connected in a first position of said switch, and wherein said second leg is electrically connected to a potential different than said first leg in a second position of said switch.

9. The plasma generation apparatus of claim 8, wherein said switch can be actuated between said first position and said second position while plasma is being generated.

10. The plasma generation apparatus of claim 1, wherein said antenna comprises only one turn.

* * * * *